US012482652B2

(12) United States Patent
Citla et al.

(10) Patent No.: US 12,482,652 B2
(45) Date of Patent: Nov. 25, 2025

(54) METHOD FOR FORMING INTEGRATED CIRCUIT STRUCTURES

(71) Applicant: APPLIED MATERIALS, INC., Santa Clara, CA (US)

(72) Inventors: Bhargav Sridhar Citla, Fremont, CA (US); Joshua Alan Rubnitz, Monte Sereno, CA (US); Jethro Tannos, San Jose, CA (US); Srinivas D. Nemani, Saratoga, CA (US); Kartik Ramaswamy, San Jose, CA (US); Yang Yang, Cupertino, CA (US)

(73) Assignee: Applied Materials Inc., Santa Clara, CA (US)

( * ) Notice: Subject to any disclaimer, the term of this patent is extended or adjusted under 35 U.S.C. 154(b) by 819 days.

(21) Appl. No.: 17/624,174

(22) PCT Filed: Jun. 19, 2020

(86) PCT No.: PCT/US2020/038718
§ 371 (c)(1),
(2) Date: Dec. 30, 2021

(87) PCT Pub. No.: WO2021/003031
PCT Pub. Date: Jan. 7, 2021

(65) Prior Publication Data
US 2022/0351969 A1    Nov. 3, 2022

Related U.S. Application Data

(60) Provisional application No. 62/869,833, filed on Jul. 2, 2019.

(51) Int. Cl.
| *H01L 21/02* | (2006.01) |
| *C23C 16/30* | (2006.01) |
| *C23C 16/455* | (2006.01) |
| *C23C 16/505* | (2006.01) |
| *C23C 16/56* | (2006.01) |
| *H01J 37/32* | (2006.01) |

(52) U.S. Cl.
CPC ...... *H01L 21/02351* (2013.01); *C23C 16/308* (2013.01); *C23C 16/505* (2013.01);
(Continued)

(58) Field of Classification Search
CPC . C23C 16/308; H01L 21/02345–02351; H01L 21/2636; H01L 2021/60165
See application file for complete search history.

(56) References Cited

U.S. PATENT DOCUMENTS

| 6,607,991 B1 | 8/2003 | Livesay et al. |
| 8,211,510 B1 | 7/2012 | Varadarajan et al. |

(Continued)

FOREIGN PATENT DOCUMENTS

| KR | 10-2012-0089792 A | 8/2012 | |
| WO | WO-2007140426 A2 * | 12/2007 | ............. C23C 16/22 |

OTHER PUBLICATIONS

European Search Report for EP 20 83 4590 dated Jul. 11, 2023.
International Search Report and Written Opinion for PCT/US2020/038718 dated Oct. 5, 2020.

*Primary Examiner* — Steven B Gauthier
*Assistant Examiner* — Candice Chan
(74) *Attorney, Agent, or Firm* — Moser Taboada

(57) ABSTRACT

Methods and apparatus for forming an integrated circuit structure, comprising: delivering a process gas to a process volume of a process chamber; applying low frequency RF power to an electrode formed from a high secondary electron emission coefficient material disposed in the process volume; generating a plasma comprising ions in the process volume; bombarding the electrode with the ions to cause the electrode to emit electrons and form an electron beam; and contacting a dielectric material with the electron beam to cure the dielectric material, wherein the dielectric material is a flowable chemical vapor deposition product. In embodi-
(Continued)

ments, the curing stabilizes the dielectric material by reducing the oxygen content and increasing the nitrogen content of the dielectric material.

15 Claims, 6 Drawing Sheets

(52) U.S. Cl.
CPC ........ *C23C 16/56* (2013.01); *H01J 37/32357* (2013.01); *H01L 21/0214* (2013.01); *H01L 21/02274* (2013.01); *H01L 21/02329* (2013.01); *H01L 21/0234* (2013.01); *C23C 16/45557* (2013.01); *H01J 37/32449* (2013.01); *H01J 2237/3321* (2013.01)

(56) References Cited

U.S. PATENT DOCUMENTS

| | | | |
|---|---|---|---|
| 8,318,584 | B2 | 11/2012 | Li et al. |
| 8,557,712 | B1 | 10/2013 | Antonelli et al. |
| 9,514,932 | B2 | 12/2016 | Mallick et al. |
| 2004/0266123 | A1 | 12/2004 | Cui et al. |
| 2007/0277734 | A1 | 12/2007 | Lubomirsky et al. |
| 2007/0298585 | A1 | 12/2007 | Lubomirsky et al. |
| 2008/0149273 | A1 | 6/2008 | Gomi et al. |
| 2011/0151173 | A1 | 6/2011 | Ramadas et al. |
| 2012/0000421 | A1 | 1/2012 | Miller et al. |
| 2014/0302690 | A1* | 10/2014 | Underwood ...... H01L 21/02126 438/787 |
| 2015/0243524 | A1 | 8/2015 | Khara et al. |
| 2015/0255305 | A1 | 9/2015 | Nakagawa |
| 2015/0368803 | A1 | 12/2015 | Yim et al. |
| 2016/0020114 | A1 | 1/2016 | Metz |
| 2016/0026089 | A1 | 1/2016 | Chen |
| 2016/0093488 | A1 | 3/2016 | Thadani et al. |
| 2016/0181089 | A1 | 6/2016 | Liang et al. |
| 2016/0194758 | A1 | 7/2016 | Nemani et al. |
| 2017/0229314 | A1 | 8/2017 | Tan et al. |
| 2017/0316946 | A1 | 11/2017 | Bajaj et al. |
| 2018/0277340 | A1 | 9/2018 | Yang et al. |
| 2018/0286669 | A1 | 10/2018 | Sasu et al. |
| 2018/0330980 | A1 | 11/2018 | Liang et al. |
| 2018/0350668 | A1 | 12/2018 | Cheng et al. |

* cited by examiner

METHOD FOR FORMING INTEGRATED CIRCUIT STRUCTURES

FIELD

Embodiments of the present disclosure generally relate to methods and apparatus for curing a substrate and forming an interconnect device. More specifically, embodiments described herein relate to methods and apparatus for electron beam reactive plasma curing of a dielectric material.

BACKGROUND

Reliably producing sub-half micron and smaller features is one of the key technology challenges for next generation very large scale integration (VLSI) and ultra large-scale integration (ULSI) of semiconductor devices. However, as the limits of circuit technology are pushed, the shrinking dimensions of VLSI and ULSI interconnect technology have placed additional demands on processing capabilities. Reliable formation of gate structures on the substrate is important to VLSI and ULSI success and to the continued effort to increase circuit density and quality of individual substrates and die.

In order to enable fabrication of next generation devices and structures, three dimensional (3D) stacking of semiconductor chips is often utilized to improve performance of the transistors. By arranging transistors in three dimensions instead of conventional two dimensions, multiple transistors may be placed in the integrated circuits (ICs) very close to each other. Three dimensional (3D) stacking of semiconductor chips reduces wire lengths and keeps wiring delay low. As the width of features such as trenches continues to shrink, the aspect ratio (depth divided by width) continues to grow for the stacking of the semiconductor chips. One challenge regarding the manufacture of high aspect ratio features such as trenches is avoiding the formation of voids during the deposition of dielectric material in the trenches.

To fill a trench, a layer of dielectric material, such as silicon oxide, is deposited. The dielectric layer typically covers the field, as well as the walls and the bottom of the feature such as a trench. If the feature is wide and shallow, completely filling the feature is not difficult. However, as the feature aspect ratio increases, the likelihood that the opening of the trench will "pinch off", forming a void or defects within the feature increases.

To decrease the likelihood of forming a void or defect within the feature such as forming seams within the trench, many different process techniques have been developed to fill in the feature with the dielectric materials with minimum defects. Poor process control during the deposition process will result in irregular structure profiles or early closure of the feature such as a trench, resulting in voids or air gap in the trench while filling the trench with the dielectric materials.

Flowable chemical vapor deposition (FCVD) is one method for filling a feature such as a trench from the bottom up avoiding void or defect formation. However dielectric material formed from FCVD methods may be unstable and may contain reactive species that react with air and problematically form a layer of material having high oxygen content, for example a high oxygen to nitrogen ratio. Annealing the films formed by FCVD method remains deficient and may not improve the overall stability and quality of a dialectic film material formed therefrom resulting in increased device resistance.

Accordingly, the inventors have provided improved curing apparatus and methods suitable for improving material formed from FCVD methods.

SUMMARY

Methods and apparatus for curing a substrate and/or forming an interconnect device are provided herein. In some embodiments, a method for forming an integrated circuit structure, includes: delivering a process gas to a process volume of a process chamber; applying RF power to an electrode formed from a high secondary electron emission coefficient material disposed in the process volume; generating a plasma including ions in the process volume; bombarding the electrode with the ions to cause the electrode to emit electrons and form an electron beam; and contacting a dielectric material with the electron beam to cure the dielectric material, wherein the dielectric material is a flowable chemical vapor deposition product.

In some embodiments, an integrated system includes: a vacuum substrate transfer chamber; a deposition chamber configured for flowable chemical vapor deposition coupled to the vacuum substrate transfer chamber; and a cure chamber coupled to the vacuum substrate transfer chamber, wherein the cure chamber is configured to cure a dielectric material using an electron beam radiation source.

In some embodiments, a computer readable medium, having instructions stored thereon which, when executed, cause a process chamber to perform a method of forming an integrated circuit structure, the method including: delivering a process gas to a process volume of a process chamber; applying RF power to an electrode formed from a high secondary electron emission coefficient material disposed in the process volume; generating a plasma comprising ions in the process volume; bombarding the electrode with the ions to cause the electrode to emit electrons and form an electron beam; and contacting a dielectric material with the electron beam to cure the dielectric material, wherein the dielectric material is a flowable chemical vapor deposition product.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
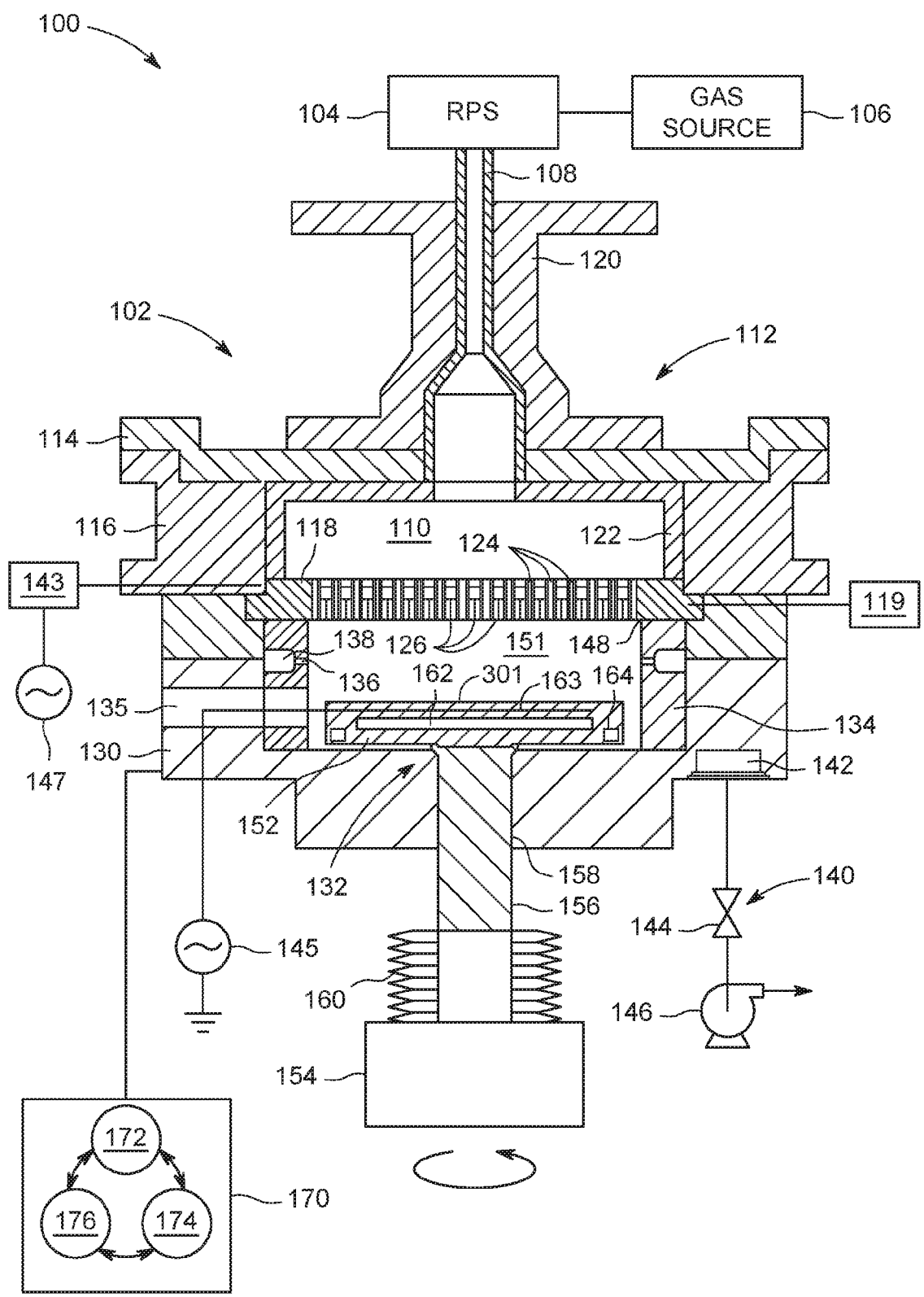
FIG. 1 depicts an apparatus suitable for performing a deposition process in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Methods and apparatus for curing a substrate and/or forming an interconnect device are provided herein. In some embodiments, a method for forming an integrated circuit structure, includes: contacting a dielectric material with an electron beam under conditions suitable for curing the dielectric material. The methods and apparatus of the present disclosure advantageously stabilize or improve dielectric material such as dielectric materials formed or deposited by FCVD methods. In embodiments, methods and apparatus of the present disclosure form variants of deposited dielectric material such as by curing the dielectric material using an electron beam to alter the make-up of the dielectric material. For example, in some embodiments, a silicon nitride layer of dielectric material may be deposited having reactive hydrogen incorporated into the silicon nitride material. Unless cured, hydrogen may problematically react with air and moisture therein to form an oxynitride layer of dielectric material, such as silicon oxynitride ($SiO_xN_y$). In some embodiments, curing in accordance with the present disclosure reduces the atomic oxygen percentage of the dielectric material and increases the atomic nitrogen percentage of the material. In some embodiments where, for example, a dielectric material formed by FCVD is silicon nitride with hydrogen incorporated therein, curing dielectric material in accordance with the present disclosure reduces unstable material formation such as $SiO_xN_y$, wherein a ratio of x to y is greater than 1.

Accordingly, the present disclosure includes depositing a dielectric material in a feature such as a trench with high aspect ratios for semiconductor devices, particularly for three dimensional (3D) stacking of semiconductor chips to provide a good gap-filling capability for the dielectric material filling in the trench from the substrate. FIG. 1 is a cross-sectional view of a deposition processing chamber 100 for performing a deposition process that can deposit a dielectric material for semiconductor applications in accordance with the present disclosure. Non-limiting suitable processing chambers that may be adapted for use herein include, for example, an HDP-PRODUCER® or C3® processing chamber available from Applied Materials, Inc. of Santa Clara, CA. Other process chambers, including ones available from other manufacturers, may also be suitably used in connection with the teachings provided herein.

Referring to FIG. 1, in embodiments the deposition processing chamber 100 includes a processing chamber body 102 and a remote plasma source 104 coupled to the processing chamber body 102. The remote plasma source 104 may be any suitable source that is capable of generating radicals. The remote plasma source 104 may be a remote plasma source, such as a radio frequency (RF) or very high radio frequency (VHRF) capacitively coupled plasma (CCP) source, an inductively coupled plasma (ICP) source, a microwave induced (MW) plasma source, an electron cyclotron resonance (ECR) chamber, or a high density plasma (HDP) chamber. The remote plasma source 104 may include one or more gas sources 106 and the remote plasma source 104 may be coupled to the deposition processing chamber 100 by a radical conduit 108. One or more process gases, which may be radical-forming gases, may enter the remote plasma source 104 via the one or more gas sources 106. In embodiments, the one or more process gases may comprise a chlorine-containing gas, fluorine containing gas, inert gas, oxygen-containing gas, a nitrogen-containing gas, a hydrogen containing gas, or any combination thereof. Radicals generated in the remote plasma source 104 travel into the deposition processing chamber 100 through the radical conduit 108 coupling to the deposition processing chamber 100, reaching an interior processing region 151 defined in the deposition processing chamber 100.

The radical conduit 108 is a part of a lid assembly 112, which also includes a radical cavity 110, a top plate 114, a lid rim 116, and a showerhead 118. The radical conduit 108 may comprise a material that is substantially nonreactive to radicals. For example, radical conduit 108 may comprise aluminum nitride (AlN), silicon dioxide ($SiO_2$), yttrium oxide ($Y_2O_3$), magnesium oxide (MgO), anodized aluminum oxide ($Al_2O_3$), oxide mineral such as sapphire, ceramics containing one or more of aluminum oxide ($Al_2O_3$), oxide mineral such as sapphire, aluminum nitride (AlN), yttrium oxide ($Y_2O_3$), magnesium oxide (MgO), or plastics. A representative example of a suitable silicon dioxide ($SiO_2$) material is quartz. The radical conduit 108 may be disposed within and supported by a radical conduit support member 120. The radical conduit support member 120 may be disposed on the top plate 114, which rests on the lid rim 116.

In embodiments, the radical cavity 110 is positioned below and coupled to the radical conduit 108, and the radicals generated in the remote plasma source 104 travel to the radical cavity 110 through the radical conduit 108. In embodiments, the radical cavity 110 includes the top plate 114, the lid rim 116 and the showerhead 118. Optionally, the radical cavity 110 may include a liner 122. The liner 122 may cover surfaces of the top plate 114 and the lid rim 116 that are exposed to the radical cavity 110. Radicals from the remote plasma source 104 pass through a plurality of tubes 124 disposed in the showerhead 118 to enter into an interior processing region 151. The showerhead 118 further includes a plurality of openings 126 that are smaller in diameter than the plurality of tubes 124. The plurality of openings 126 are connected to an internal volume (not shown) that is not in fluid communication with the plurality of tubes 124. One or more fluid sources 119 may be coupled to the showerhead 118 for introducing a fluid mixture into an interior processing region 151 of the deposition processing chamber 100. The fluid mixture may include precursor, porogen, and/or carrier fluids. The fluid mixture may be a mixture of gases and liquids.

The deposition processing chamber 100 may include the lid assembly 112, a chamber body 130 and a substrate support assembly 132. The substrate support assembly 132 may be at least partially disposed within the chamber body 130. The chamber body 130 may include a slit valve 135 to provide access to the interior of the deposition processing chamber 100. The chamber body 130 may include a liner 134 that covers the interior surfaces of the chamber body 130. The liner 134 may include one or more apertures 136 and a pumping channel 138 formed therein that is in fluid communication with a vacuum system 140. The apertures 136 provide a flow path for gases into the pumping channel 138, which provides an egress for the gases within the deposition processing chamber 100.

The vacuum system 140 may include a vacuum port 142, a valve 144 and a vacuum pump 146. The vacuum pump 146 is in fluid communication with the pumping channel 138 via the vacuum port 142. The apertures 136 allow the pumping channel 138 to be in fluid communication with the interior processing region 151 within the chamber body 130. The interior processing region 151 includes a lower surface 148 of the showerhead 118 and an upper surface 150 of the substrate support assembly 132, and the interior processing region 151 is surrounded by the liner 134.

The substrate support assembly 132 may include a substrate support member 152 to support a substrate (not shown) for processing within the chamber body 130. The substrate may be any standard wafer size, such as, for example, 300 mm. Alternatively, the substrate may be larger than 300 mm, such as 450 mm or larger. The substrate support member 152 may comprise aluminum nitride (AlN) or aluminum, depending on operating temperature. The substrate support member 152 may be configured to chuck the substrate to the substrate support member 152. For example, the substrate support member 152.

The substrate support member 152 may be coupled to a lift mechanism 154 through a shaft 156 which extends through a centrally-located opening 158 formed in a bottom surface of the chamber body 130. The lift mechanism 154 may be flexibly sealed to the chamber body 130 by bellows 160 that prevents vacuum leakage from around the shaft 156. The lift mechanism 154 allows the substrate support member 152 to be moved vertically within the chamber body 130 between a process position and a lower, transfer position. The transfer position is slightly below the opening of the slit valve 135. During operation, the spacing between the substrate 301 and the showerhead 118 may be minimized in order to maximize radical flux at the substrate surface. For example, the spacing may be between about 100 mm and about 5,000 mm. The lift mechanism 154 may be capable of rotating the shaft 156, which in turn rotates the substrate support member 152, causing the substrate disposed on the substrate support member 152 to be rotated during operation.

One or more heating elements 162 and a cooling channel 164 may be embedded in the substrate support member 152. The heating elements 162 and cooling channel 164 may be used to control the temperature of the substrate during operation. The heating elements 162 may be any suitable heating elements, such as one or more resistive heating elements. The heating elements 162 may be connected to one or more power sources (not shown). The heating elements 162 may be controlled individually to have independent heating and/or cooling control on multi-zone heating or cooling. With the ability to have independent control on multi-zone heating and cooling, the substrate temperature profile can be enhanced at any giving process conditions. A coolant may flow through the cooling channel 164 to cool the substrate. The substrate support member 152 may further include gas passages extending to the upper surface 150 for flowing a cooling gas to the backside of the substrate.

A RF source power 143 may be coupled to the showerhead 118 through a RF source power matching box 147. The RF source power 143 may be low frequency, high frequency, or very high frequency. In some embodiments, the RF source power 143 is a high frequency RF generator that may generate high density plasma for deposit high density film layers. In one example, the RF source power 143 may serve as an inductively coupled RF energy transmitting device that can generate and control the inductive coupled plasma (ICP) generated in the interior processing region 351 above the substrate support member 152. Dynamic impedance matching from the RF source power matching box 147 may be provided when generating the inductive coupled plasma (ICP).

In addition to the RF source power 143, a RF bias power source 145 may be coupled to the substrate support member 152. The substrate support member 152 is configured as a cathode and includes an electrode 163 that is coupled to the RF bias power source 145. The RF bias power source 145 is coupled between the electrode 163 disposed in the substrate support member 152 and another electrode, such as the showerhead 118 or ceiling such as top plate 114 of the chamber body 130. The RF bias power generated from the RF bias power source 145 excites and sustains a plasma discharge formed from the gases disposed in the interior processing region 151 of the chamber body 130.

In one mode of operation, the substrate 301 is disposed on the substrate support member 152 in the deposition processing chamber 100. A process gas and/or gas mixture is introduced into the chamber body 130 through the showerhead 118 from the gas sources 106. The vacuum pump 146 maintains the pressure inside the chamber body 130 while removing deposition byproducts.

A controller 170 is coupled to the deposition processing chamber 100 to control operation of the deposition processing chamber 100. The controller 170 includes a central processing unit (CPU) 172, a memory 174, and a support circuit 176 utilized to control the process sequence and regulate the gas flows from the gas sources 106. The central processing unit (CPU) 172 may be any form of general purpose computer processor that may be used in an industrial setting. The software routines can be stored in the memory 174, such as random access memory, read only memory, floppy, or hard disk drive, or other form of digital storage. The support circuit 176 is conventionally coupled to the central processing unit (CPU) 172 and may include cache, clock circuits, input/output systems, power supplies, and the like. Bi-directional communications between the controller 170 and the various components of the deposition processing chamber 100 are handled through numerous signal cables.

Figure 2:
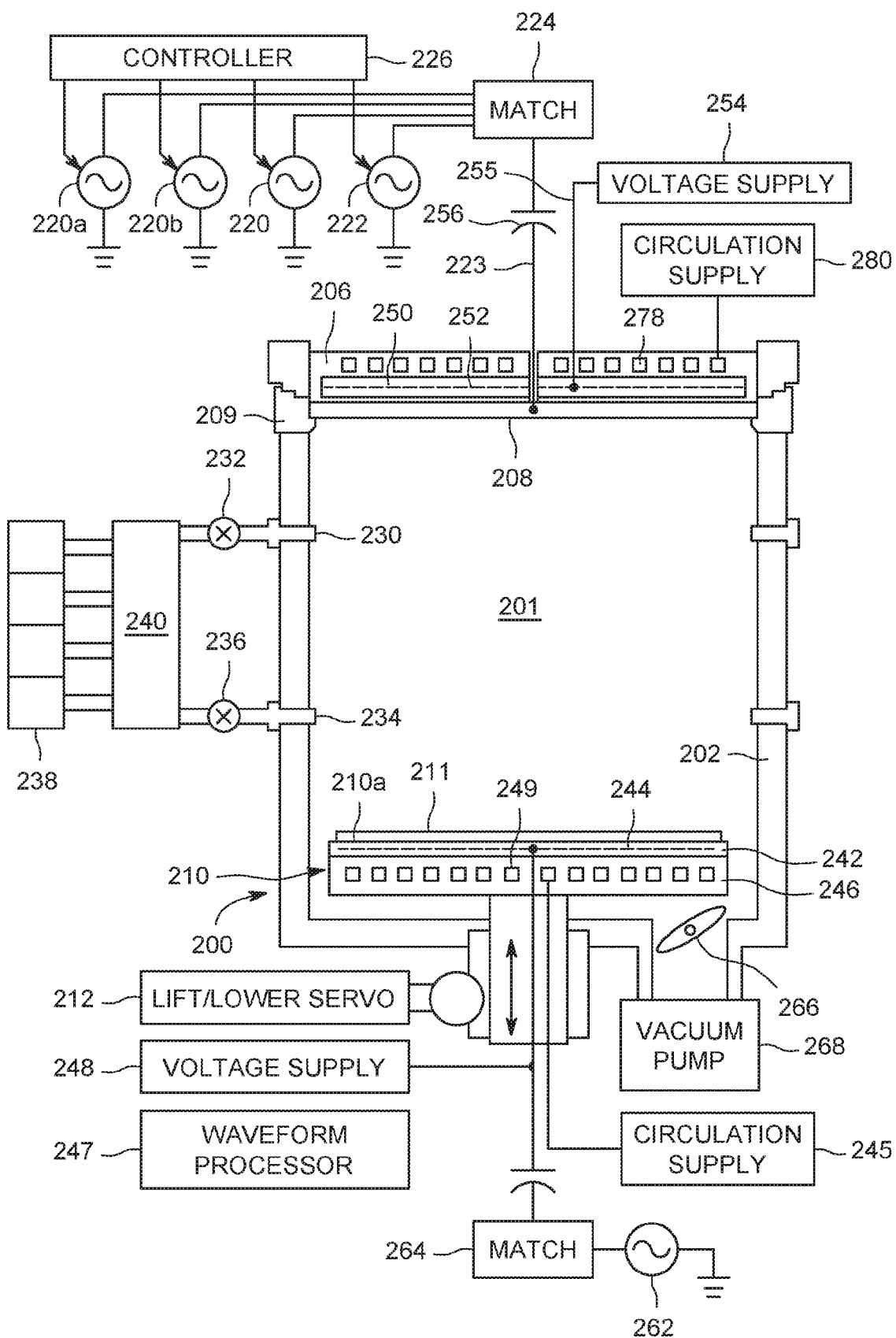
FIG. 2 depicts an apparatus suitable for curing a dialectic layer in accordance with some embodiments of the present disclosure.

The methods and apparatus of the present disclosure include curing a dielectric material in a feature such as a trench with high aspect ratios for semiconductor devices, and particularly for stabilizing or altering the dielectric material. Referring now to FIG. 2 a cross-sectional view of an electron beam processing chamber 200 suitable for curing dielectric material of the present disclosure is shown. In embodiments, the electron beam processing chamber 200 has a chamber body 202 which defines a process volume 201. In one embodiment, the chamber body 202 has a substantially cylindrical shape and may be fabricated from a material suitable for maintaining a vacuum pressure environment therein, such as metallic materials, for example aluminum or stainless steel.

In embodiments, a ceiling 206 is coupled to the chamber body 202 and forms the process volume 201. In one embodiment, the ceiling 206 is formed from an electrically conductive material, such as the materials utilized to fabricate the chamber body 202. The ceiling 206 is coupled to and supports an electrode 208 thereon. In one embodiment, the electrode 208 is coupled to the ceiling 206 such that the electrode 208 is disposed adjacent the process volume 201. In one embodiment, the electrode 208 is formed from a process-compatible material having a high secondary electron emission coefficient, such as silicon, carbon, silicon carbon materials, or silicon-oxide materials. Alternatively, the electrode 208 is formed from a metal oxide material such as aluminum oxide ($Al_2O_3$), yttrium oxide ($Y_2O_3$), or zirconium oxide ($ZrO_2$). A dielectric ring 209, which is formed from an electrically insulating material, is coupled to the chamber body 202 and surrounds the electrode 208. As illustrated, the dielectric ring 209 is disposed between the chamber body 202 and the ceiling 206 and supports the electrode 208 thereon.

A pedestal 210 is disposed in the process volume 201. The pedestal 210 supports a substrate 211 thereon and has a substrate support surface 210a oriented parallel to the electrode 208. In one embodiment, the pedestal 210 is movable in the axial direction by a lift servo 212. During operation, a substrate support surface 210a is maintained at a distance of between about 1 inch and about 30 inches from the top electrode such as electrode 208. In one embodiment, the pedestal 210 includes an insulating puck 242 which forms the substrate support surface 210a, an electrode 244 disposed inside the insulating puck 242, and a chucking voltage supply 248 connected to the electrode 244. Additionally, a base layer 246 underlying the insulating puck 242 has internal passages 249 for circulating a thermal transfer medium (e.g., a liquid) from a circulation supply 245. In one embodiment, the circulation supply 245 functions as a heat sink. In another embodiment, the circulation supply 245 functions as a heat source. In one embodiment, a temperature of the pedestal 210 is maintained between about −20° C. and about 1000° C.

An RF power generator 220 having a VHF frequency (e.g., 160 MHz) and a lower frequency RF power generator such as RF power generator 222 having a frequency below the VHF range or below the HF range (e.g., in the MF or LF range, e.g., between about 100 kHz and about 60 MHz, such as about 2 MHz) are coupled to the electrode 208 through an impedance match 224 via an RF feed conductor 223. In one embodiment, the impedance match 224 is adapted to provide an impedance match at the different frequencies of the RF power generators 220 and 222, as well as filtering to isolate the power generators from one another. Output power levels of the RF power generators 220, 222 are independently controlled by a controller 226. As will be described in detail below, power from the RF power generators 220, 222 is coupled to the electrode 208.

In one embodiment, the ceiling 206 is electrically conductive and is in electrical contact with the electrode 208. Power from the impedance match 224 is conducted through the ceiling 206 to the electrode 208. In one embodiment, the chamber body 202 is maintained at ground potential. In one embodiment, grounded internal surfaces (i.e. chamber body 202) inside the electron beam processing chamber 200 are coated with a process compatible material such as silicon, carbon, silicon carbon materials, or silicon-oxide materials. In an alternative embodiment, grounded internal surfaces inside the electron beam processing chamber 200 are coated with a material such as aluminum oxide ($Al_2O_3$), yttrium oxide ($Y_2O_3$), or zirconium oxide ($ZrO_2$).

In one embodiment, the RF power generator 220 is replaced by two VHF power generators 220a and 220b that are separately controlled. The VHF power generator 220a has an output frequency in a lower portion (e.g., 30 MHz to 150 MHz) of the VHF band, while the VHF power generator 220b has an output frequency in an upper portion (e.g., 150 MHz to 300 MHz) of the VHF band. The controller 226 governs plasma ion density by selecting the ratio between the output power levels of the VHF power generators 220a and 220b.

With the two VHF power generators 220a and 220b, radial plasma uniformity in the process volume 201 can be controlled by selecting a distance between the electrode 208 and pedestal 210. In some embodiments, the lower VHF frequency produces an edge-high radial distribution of plasma ion density in the process volume 201 and the upper VHF frequency produces a center-high radial distribution of plasma ion density. With such a selection, the power levels of the two VHF power generators 220a, 220b are capable of generating a plasma with a substantially uniform radial plasma ion density.

In one embodiment, the ceiling 206 is a support for the electrode 208 and includes an insulating layer 250 containing a chucking electrode 252 facing the electrode 208. A DC chucking voltage supply 254 is coupled to the chucking electrode 252 via the feed conductor 255, for electrostatically clamping the electrode 208 to the ceiling 206. A DC blocking capacitor 256 is connected in series with the output of the impedance match 224. The controller 226 functions to control the DC chucking voltage supply 254. In one embodiment, the RF feed conductor 223 from the impedance match 224 is connected to the electrode support or ceiling 206 rather than being directly connected to the electrode 208. In such an embodiment, RF power from the RF feed conductor 223 is capacitively coupled from the electrode support to the electrode 208.

In one embodiment, internal passages 278 for conducting a thermally conductive liquid or media inside the ceiling 206 are connected to a thermal media circulation supply 280. The thermal media circulation supply 280 acts as a heat sink or a heat source. The mechanical contact between the electrode 208 and the ceiling 206 is sufficient to maintain high thermal conductance between the electrode 208 and the ceiling 206. In the embodiment of FIG. 2, the force of the mechanical contact is regulated by the electrostatic clamping force provided by the DC chucking voltage supply 254.

In one embodiment, upper gas injectors 230 provide process gas into the process volume 201 through a first valve 232. In one embodiment, lower gas injectors 234 provide process gas into the process volume 201 through a second valve 236. The upper gas injectors 230 and the lower gas injectors 234 are disposed in sidewalls of the chamber body 202. Gas is supplied from an array of process gas supplies such as supplies 238 through an array of valves 240 which may include the first valve 232 and second valves 236. In one embodiment, gas species and gas flow rates delivered into the process volume 201 are independently controllable. For example, gas flow through the upper gas injectors 230 may be different from gas flow through the lower gas injectors 234. The controller 226 governs the array of valves 240.

In one embodiment, an inert gas, such as argon or helium, is supplied into the process volume 201 through the upper gas injectors 230 and a process gas is supplied into the process volume 201 through the lower gas injectors 234. In some embodiments, the inert gas delivered to the process volume 201 adjacent the electrode 208 functions to buffer the electrode 208 from a reactive plasma formed in the process volume 201, thus increasing the useful life of the electrode 208. In another embodiment, process gas is supplied to the process volume 201 through both the upper gas injectors 230 and the lower gas injectors 234.

In some embodiments, plasma is generated in the process volume 201 by various bulk and surface processes, for example, by capacitive coupling. In one embodiment, plasma generation is also facilitated by energetic ion bombardment of the interior surface of the top electron-emitting electrode such as electrode 208. In one example, the electrode 208 is biased with a substantially negative charge, such as by application of voltage from the DC chucking voltage supply 254. In one embodiment, bias power applied to the electrode 208 is between about 1 KW and about 10 KW with a frequency of between about 400 kHz and about 200 MHz. The inventors believe that ions generated by a capacitively coupled plasma are influenced by an electric field that encourages bombardment of the electrode 208 by the ions generated from the plasma.

The ion bombardment energy of the electrode 208 and the plasma density are functions of both RF power generators 220 and 222. The ion bombardment energy of the electrode 208 is substantially controlled by the lower frequency power from the RF power generator 222 and the plasma density in the process volume 201 is substantially controlled (enhanced) by the VHF power from the RF power generator 220. In some embodiments, ion bombardment of the electrode 208 causes the electrode to emit secondary electrons. Energetic secondary electrons, which have a negative charge, are emitted from the interior surface of the electrode 208 and accelerated away from the electrode due to the negative bias of the electrode 208.

The flux of energetic electrons from the emitting surface of the electrode 208 is believed to be an electron beam, and may be oriented substantially perpendicular to the interior surface of the electrode 208. A beam energy of the electron beam is approximately equal to the ion bombardment energy of the electrode 208, which typically can range from about 10 eV to 20,000 eV. In some embodiments, ion bombardment energy suitable for curing in accordance with the present disclosure is from about 50 eV to 4,000 eV. In one embodiment, the plasma potential is greater than the potential of the electrode 208 and the energetic secondary electrons emitted from the electrode 208 are further accelerated by a sheath voltage of the plasma as the secondary electrons traverse through the plasma.

At least a portion of the electron beam, comprised of the secondary electron flux emitted from electrode 208 due to energetic ion bombardment of the electrode surface, propagates through the process volume 201 and reacts with process gases near the substrate 211. With utilization of suitable process gases, such as helium (He), argon (Ar), hydrogen ($H_2$), ammonia ($NH_3$), disilane ($Si_2He$), methane ($CH_4$), acetylene ($C_2H_2$); nitrogen trifluoride ($NF_3$), tetrafluoromethane ($CF_4$), sulfur hexafluoride ($SF_6$), carbon monoxide (CO), trifluoromethane ($CHF_3$), chlorine ($Cl_2$), hydrogen bromide (HBr), nitrogen ($N_2$), oxygen ($O_2$), combinations thereof, and the like, the electron beam induces curing reactions on the substrate 211. In some embodiments, the electron beams, in addition to the capacitively generated plasma, generate chemically reactive radicals and ions which adsorb to the surface of the substrate and form a chemically reactive layer of the surface of the substrate 211. The electron beam bombardment of the chemically reactive layer causes generation of products which results in curing of the substrate 211. In some embodiments, the chemically reactive polymer layer causes alteration of the substrate such as reduction (reducing or eliminating oxygen) or addition of nitrogen. In some embodiments, the process gases are preselected to cause a desired alteration of the substrate. For example, a nitrogen containing process gas may be preselected to increase the nitrogen content of the substrate such as a dielectric material.

Accordingly, the electron beam induces chemical reactions to liberate certain species in a substrate such as oxygen, or add one or more species to a substrate such as nitrogen to a dielectric material and cure the substrate 211. Curing of the substrate 211 is also influenced by other factors, such as pressure, wafer or substrate temperature, electron beam energy, ebeam plasma power, and bias power if needed. In one embodiment, a pressure maintained in the process volume 201 during electron beam curing of the substrate 211 at between about 3.0 mTorr and about 100 mTorr. The pressure is generated by a vacuum pump 268 which is in fluid communication with the process volume 201. The pressure is regulated by a gate valve 266 which is disposed between the process volume 201 and the vacuum pump 268. Curing of the substrate 211 is also influenced by substrate temperature during electron beam curing. Suitable curing temperatures for use herein include between 0 and 500 degrees Celsius. Curing of the substrate 211 is also influenced by electron beam energy which in some embodiments includes a peak value 50 to about 4000 eV. In some embodiments, the ebeam plasma power may be from about 100 W to about 5000 W. In some embodiments, the electron beam processing chamber is configured to provide a bias power to the substrate of from about 30 W to about 5000 W.

In some embodiments, an RF bias power generator 262 is coupled through an impedance match 264 to the electrode 244 of the pedestal 210. In a further embodiment, a waveform tailoring processor 247 may be connected between the output of the impedance match 264 and the electrode 244. The waveform tailoring processor 247 changes the waveform produced by the RF bias power generator 262 to a desired waveform. The ion energy of plasma near the substrate 211 is controlled by the waveform tailoring processor 247. In some embodiments, the waveform tailoring processor 247 produces a waveform in which the amplitude is held during a certain portion of each RF cycle at a level corresponding to a desired ion energy level. The controller 226 controls the waveform tailoring processor 247.

Figure 3:
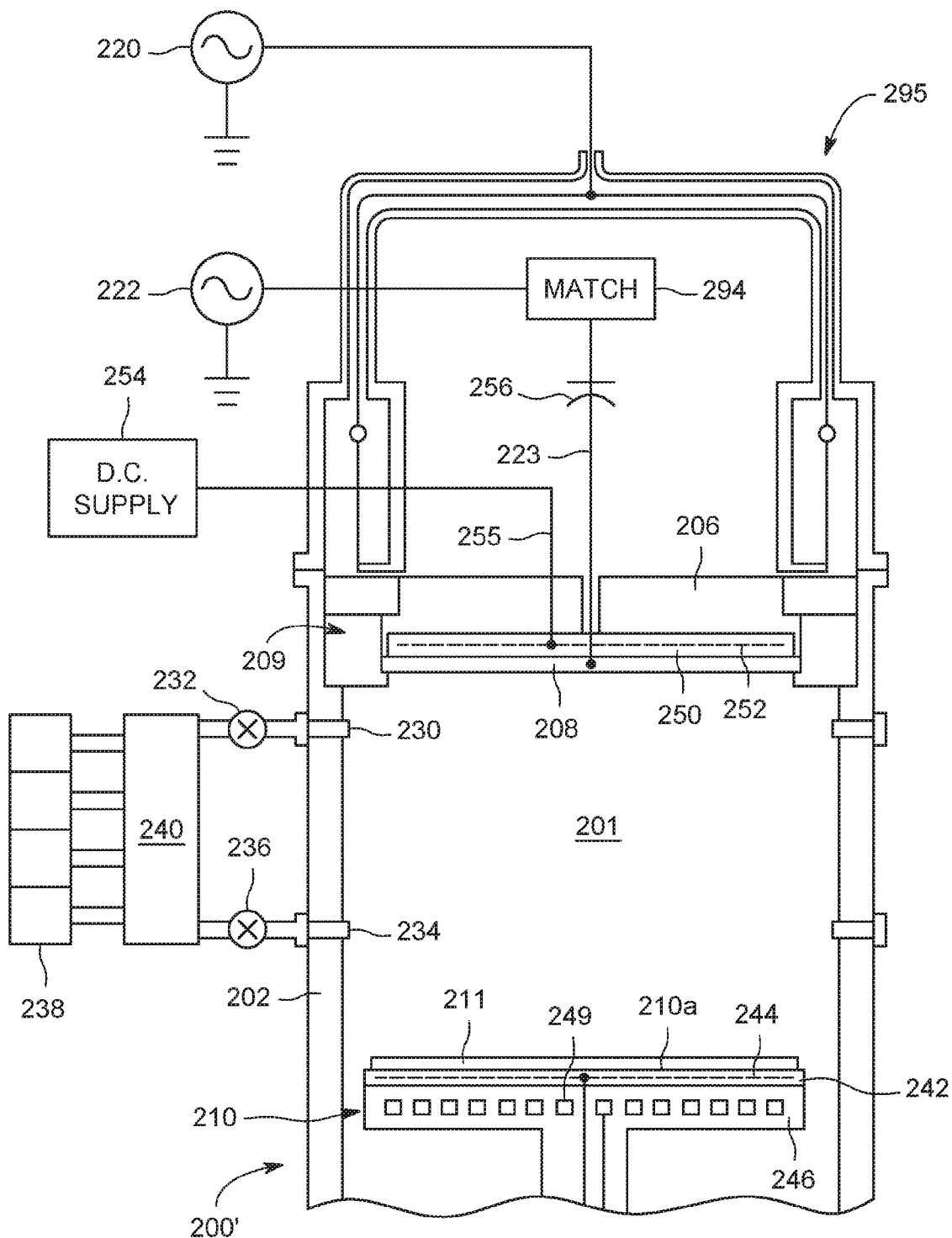
FIG. 3 depicts an apparatus different than the apparatus of FIG. 2, but suitable for curing a dialectic layer in accordance with some embodiments of the present disclosure.

FIG. 3 schematically illustrates another embodiment of the electron beam processing chamber 200'. In some embodiments of FIG. 2, the VHF power (from the RF power generator 220) and the lower frequency RF power (from the RF power generator 222) are delivered to the electrode 208 through separate paths. In the embodiment of FIG. 3, the RF power generator 220 is coupled to the electrode 208 through a folded resonator 295 overlying an edge of the electrode 208. The lower frequency RF power generator 222 is coupled to the electrode 208 via the RF feed conductor 223 through an RF impedance match 294. The DC chucking voltage supply 254 is coupled to the chucking electrode 252 through the feed conductor 255 extending through a passage in the ceiling 206.

Figure 4:
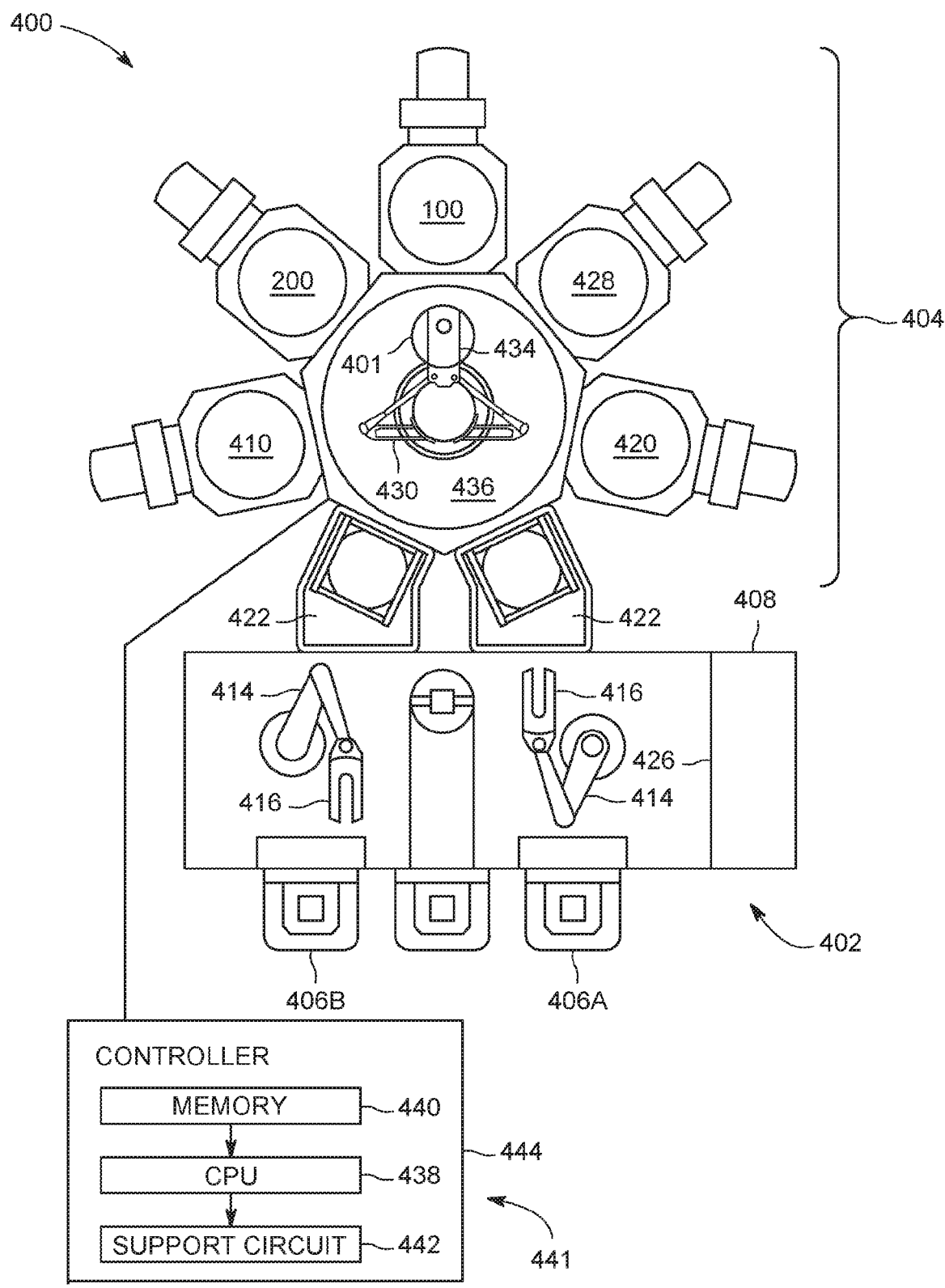
FIG. 4 depicts a top plan view of a processing tool including the apparatus of FIG. 1 and apparatus of FIG. 2 or FIG. 3, in accordance with some embodiments of the present disclosure.

FIG. 4 is a schematic, top plan view of an exemplary integrated system 400 that includes one or more of the deposition processing chambers 100 illustrated in FIG. 1 and/or electron beam processing chamber 200 illustrated in FIG. 2 or FIG. 3 that is incorporated and integrated therein. In one embodiment, the integrated system 400 may be a CENTURA® integrated processing system, commercially available from Applied Materials, Inc., located in Santa Clara, CA Other processing systems (including those from other manufacturers) may be adapted to benefit from the disclosure.

In some embodiments, the integrated system 400 includes a vacuum-tight processing platform such as processing platform 404, a factory interface 402, and a system controller 444. The processing platform 404 includes at least one deposition processing chamber 100, such as the one of the deposition processing chamber 100 depicted from FIG. 1, at least one electron beam processing chamber 200, such as the one of the electron beam processing chamber 200 depicted from FIG. 2, a plurality of processing chambers 428, 420, 410 and at least one load lock chamber 422 that is coupled to a vacuum substrate transfer chamber such as transfer chamber 436. Two load lock chambers 422 are shown in FIG. 4. The factory interface 402 is coupled to the transfer chamber 436 by the load lock chambers 422.

In one embodiment, the factory interface 402 comprises at least one docking station 408 and at least one factory interface robot 414 to facilitate transfer of substrates. The docking station 408 is configured to accept one or more front opening unified pod (FOUP). Two FOUPS 406A-B are shown in the embodiment of FIG. 4. The factory interface robot 414, having a blade 416 disposed on one end of the factory interface robot 414, is configured to transfer the substrate from the factory interface 402 to the processing platform 404 for processing through the load lock chambers 422. Optionally, one or more processing chambers 410, 420, 428, deposition processing chamber 100, electron beam processing chamber 200 may be connected to a terminal 426 of the factory interface 402 to facilitate processing of the substrate from the FOUPS 406A-B.

Each of the load lock chambers 422 have a first port coupled to the factory interface 402 and a second port coupled to the transfer chamber 436. The load lock chambers 422 are coupled to a pressure control system (not shown) which pumps down and vents the load lock chambers 422 to facilitate passing the substrate between the vacuum environment of the transfer chamber 436 and the substantially ambient (e.g., atmospheric) environment of the factory interface 402.

The transfer chamber 436 has a vacuum robot 430 disposed therein. The vacuum robot 430 has a blade 434 capable of transferring substrates 401 among the load lock chambers 422, the deposition processing chamber 100, electron beam processing chamber 200, and the processing chambers 410, 420, and 428.

In some embodiments of the integrated system 400, the integrated system 400 may include a deposition processing chamber 100 depicted in FIG. 1, and other processing chambers 410, 420, 428, electron beam processing chamber 200, and/or electron beam processing chamber 200'. In some embodiments, processing chambers 410, 420, 428 may be a deposition chamber, etch chamber, thermal processing chamber or other similar type of semiconductor processing chamber.

The system controller 444 is coupled to the processing system 400. The system controller 444, which may include the computing device 441 or be included within the computing device 441, controls the operation of the processing system 400 using a direct control of the processing chambers 410, 420, 428, deposition processing chamber 100, electron beam processing chamber 200 of the integrated system 400. Alternatively, the system controller 444 may control the computers (or controllers) associated with the processing chambers 410, 420, 428, deposition processing chamber 100, electron beam processing chamber 200 and the integrated system 400. In operation, the system controller 444 also enables data collection and feedback from the respective chambers and the processing chambers such as deposition processing chamber 100, and/or electron beam processing chamber 200 to optimize performance of the integrated system 400.

The system controller 444 generally includes a central processing unit (CPU) 438, a memory 440, and support circuits 442. The CPU 438 may be one of any form of a general purpose computer processor that can be used in an industrial setting. The support circuits 442 are conventionally coupled to the CPU 438 and may comprise cache, clock circuits, input/output subsystems, power supplies, and the like. The software routines transform the CPU 438 into a specific purpose computer (controller) 444. The software routines may also be stored and/or executed by a second controller (not shown) that is located remotely from the integrated system 400.

In some embodiments, the present disclosure relates to an integrated system including: a vacuum substrate transfer chamber; a deposition chamber configured for flowable chemical vapor deposition coupled to the vacuum substrate transfer chamber; and a cure chamber coupled to the vacuum substrate transfer chamber, wherein the cure chamber is configured to cure a dielectric material using an electron beam radiation source. In some embodiments, the cure chamber of the integrated system is configured to maintain the dielectric material at a temperature of 0 degrees Celsius to 500 degrees Celsius. In some embodiments, the cure chamber is configured to maintain the dielectric material at a pressure of 3 mTorr to 100 mTorr. In some embodiments, the cure chamber is configured to apply a bias power to the dielectric material in an amount of 30 W to 5000 W. In some embodiments, the cure chamber is configured to provide 100 W to about 5000 W plasma power. In some embodiments, the cure chamber is configured to form an electron beam from a reaction comprising a process gas comprising one or more of helium (He), argon (Ar), hydrogen ($H_2$), ammonia ($NH_3$), disilane ($Si_2H_6$), methane ($CH_4$), acetylene ($C_2H_2$), nitrogen trifluoride ($NF_3$), tetrafluoromethane ($CF_4$), sulfur hexafluoride ($SF_6$), carbon monoxide (CO), trifluoromethane ($CHF_3$), chlorine ($Cl_2$), hydrogen bromide (HBr), nitrogen ($N_2$), oxygen ($O_2$), and combinations thereof. In some embodiments, the deposition chamber is configured to form a dielectric material at a temperature of 0 degrees Celsius to 100 degrees Celsius. In some embodiments, the deposition chamber is configured to form a dielectric material at a pressure of 100 mTorr to 5 Torr. In some embodiments, the deposition chamber is configured to form a dielectric material while applying a bias power to the dielectric material in an amount of 30 W to 5000 W.

Figure 5:
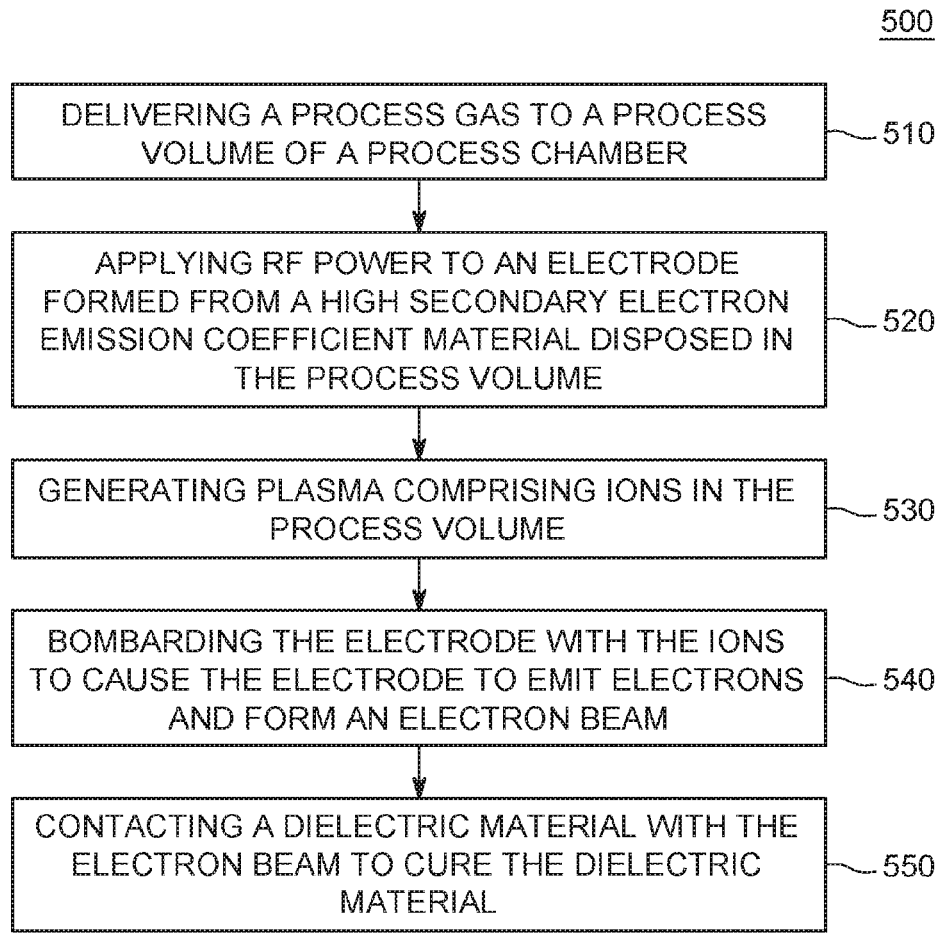
FIG. 5 is a process flow diagram illustrating a method for forming a dielectric material in accordance with some embodiments of the present disclosure.

FIG. 5 is a flow chart depicting operations of a method 500 for forming an integrated circuit structure according to an embodiment described herein. At operation 510, a process gas is delivered to a process volume of electron beam processing chamber, such as the process volume 201 of the electron beam processing chamber 200 of FIG. 2. Various process gases, such the process gas comprising one or more of helium (He), argon (Ar), hydrogen ($H_2$), ammonia ($NH_3$), disilane ($Si_2H_6$), methane ($CH_4$), acetylene ($C_2H_2$), nitrogen trifluoride ($NF_3$), tetrafluoromethane ($CF_4$), sulfur hexafluoride ($SF_6$), carbon monoxide (CO), trifluoromethane ($CHF_3$), chlorine ($CL_2$), hydrogen bromide (HBr), nitrogen ($N_2$), oxygen ($O_2$), and combinations thereof are delivered to the process volume 201 through the upper gas injectors 230, 234 from the supplies 238. In one embodiment, an inert gas is also delivered to the process volume 201. In some embodiments, the inert gas is delivered through the upper gas injectors 230. Although not illustrated with regard to FIG. 2, in another embodiment, the inert gas is delivered through the top electrode such as electrode 208.

At operation 520, RF power such as low frequency RF power is delivered to an electrode disposed in the process volume. In embodiments, the electrode is formed from a high secondary electron emission coefficient material disposed in the process volume. In one embodiment, low frequency RF power having a frequency of about 2 MHz or about 13.56 MHz is applied to the top electrode such as electrode 208. In some embodiments, the RF power is applied to the top electrode such as electrode 208 in a pulsed manner. In some embodiments, the RF power is applied to the top electrode such as electrode 208 continuously. The RF power applied to the top electrode such as electrode 208 functions to energize the process gases in the process volume 201 and form a plasma in operation 530. By utilizing low frequency RF power, generating a plasma with a high sheath voltage is possible, which facilitates acceleration of electrons subsequently emitted from the top electrode such as electrode 208.

In some embodiments, the pedestal 210 is maintained at ground potential. In some embodiments, low frequency RF power is applied to the pedestal 210. In some embodiments, the RF power applied to the pedestal 210 is concurrent with RF power applied to the electrode 208. Alternatively, the RF power applied to the pedestal 210 is delivered when substantially no RF power is applied to the electrode 208. In some embodiments where RF power is applied to the pedestal 210, the RF power is controlled to reduce adverse influence on the plasma sheath potential to prevent retardation of electron beams from reaching the substrate 211.

In some embodiments, RF power applied to the top electrode such as electrode 208 can be synchronized with the RF power applied to the pedestal 210 by pulsing such that the duty cycles of the top electrode RF power and the pedestal 210 RF power do not overlap. As a result, electrical biasing within the process volume 201 is not substantially limited and retardation of electron beams due to plasma sheath bias potential is substantially mitigated.

At operation 540, the electrode is bombarded with ions from the plasma. In some embodiments, the plasma has a predominantly positive charge and the top electrode such as electrode 208 has a predominantly negative charge. Ions from the plasma are influenced by an electric field generated in the process volume 201 and the ions which are accelerated toward the top electrode such as electrode 208 heat the top electrode such as electrode 208. Because the top electrode is formed from a material having a high secondary electron emission coefficient, the ion bombardment of the top electrode such as electrode 208 causes electrons to be emitted from the top electrode such as electrode 208.

At operation 550, electrons emitted from the electrode are accelerated toward a substrate. For example, electrons emitted from the top electrode such as electrode 208 are accelerated toward the substrate 211. Due to the substantially negative charge of the top electrode such as electrode 208, the negatively charged electrons are repelled by the top electrode such as electrode 208 and toward the substrate 211. In some embodiments, the plasma sheath voltage potential further functions to accelerate the electrons toward the substrate 211. As the electrons are accelerated by the plasma sheath voltage, the electrons acquire energy of between about 50 electron volts (eV) and about 4,000 eV upon entry into the plasma. The electrons emitted from the top electrode such as electrode 208 generate a large area secondary electron beam. The electron beam has an energy distribution which is substantially uniform across a diameter of the substrate 211. In some embodiments, the electron beam contacts the substrate such as a dielectric material to cure the dielectric material. For example, material such as dielectric material of the substrate is cured when contacted with the electron beam.

In some embodiments, the electrons in the electron beam react with the process gases to further generate additional radicals and ions which adsorb to surfaces of the substrate 211. In some embodiments, the adsorbed materials form a chemically reactive layer on surfaces of the substrate. In some embodiments, the electron beam alters the composition of substrate 211. For example, in some embodiments, substrate 211 comprises a dielectric material that may form of an oxynitride layer upon contact with air. For example, silicon nitride containing hydrogen may problematically form an oxynitride layer such as silicon oxynitride, wherein the silicon oxynitride nitride is characterized as $SiO_xN_y$, such as $SiO_xN_y$, $1 \leq x \leq 2$, and $1 \leq y \leq 2$. In some embodiments, $x(=O/Si)$, and $y(=N/Si)$. In embodiments, the silicon oxynitride is characterized as $SiO_xN_y$, and curing the dielectric material or contacting with the electron beam reduces x and increases y. For example, upon curing a ratio of y to x is changed such that the ration of y to x is greater than 1 compared to the silicon oxynitride prior to cure or contact with the electron beam as described herein. In some embodiments, the atomic ratio of y and x is altered to be greater than 1 upon cure or contact with an electron beam in accordance with the present disclosure. In some embodiments, the silicon oxynitride is characterized as $(SiO_xN_y)$ and curing the dielectric material or contacting with the electron beam lowers the atomic percentage of oxygen and/or increases the atomic percentage of nitrogen. In some embodiments, (SiOxNy; x>y) changes to (SiOxNy; y>x) upon cure or contact with the electron beam in accordance with the present disclosure. In some embodiments, during the cure the dielectric material is maintained at a temperature of 0 to 500 degrees Celsius, such as 100 to 400 degrees Celsius, or 200 to 300 degrees Celsius. In some embodiments, during the cure the dielectric material is maintained at a pressure in a process chamber of from about 3 to about 100 mTorr, such as 10 mTorr to 75 mTorr. In some embodiments, during the cure the dielectric material is subjected to a bias power in an amount of 30 to 5000 W. In some embodiments, curing in accordance with the present disclosure prevents the formation of oxynitride such as silicon oxynitride.

In some embodiments, a process gas is preselected to alter the dielectric layer as desired. For example, the process gas may be selected from one or more of helium (He), argon (Ar), hydrogen ($H_2$), ammonia ($NH_3$), disilane ($Si_2H_6$), methane ($CH_4$), acetylene ($C_2H_2$), nitrogen trifluoride ($NF_3$), tetrafluoromethane ($CF_4$), sulfur hexafluoride ($SF_6$), carbon monoxide (CO), trifluoromethane ($CHF_3$), chlorine ($CL_2$), hydrogen bromide (HBr), nitrogen ($N_2$), oxygen ($O_2$), and combinations thereof. In embodiments, ammonia ($NH_3$) is used to increase nitrogen content of the dielectric layer. In embodiments, disilane ($Si_2H_6$), is used to increase silicon content of the dielectric layer.

In embodiments, the substrate 211 is a dielectric material layer or film such as an oxynitride layer and may comprise silicon oxynitride may comprise, oxygen and nitrogen. The inventors have found the amount of oxygen negatively affects the stability of a deposited film such as a film formed by FCVD. In some embodiments, the ratio of an oxygen to nitrogen may affect the resistance in the semiconductor device. For example, small amounts of oxygen compared to nitrogen in the dielectric layer promotes stability and lowers resistance of the dielectric layer. For example, desired target dielectric layer material upon curing may comprise or consist essentially of silicon and nitrogen.

In some embodiments, the curing process described herein is useful for forming interconnect devices, and beneficial where depositing the dielectric material upon a substrate is performed by a flowable chemical vapor deposition (FCVD) process. Accordingly, the present disclosure includes depositing a dielectric material in a feature such as a trench with high aspect ratios for semiconductor devices, particularly for three dimensional (3D) stacking of semiconductor chips. In one embodiments, the deposition process may use remote plasma along with RF bias power in pulsed mode supplied to a substrate support assembly on which the substrate is placed. In some embodiments, the deposition process is performed without in-chamber RF source power generation. The remote plasma generated remotely and the pulsed RF bias power may be supplied to an interior processing region of the processing chamber simultaneously, alternately or sequentially as needed to provide a good gap-filling capability for the dielectric material filling in the trench from the substrate. In embodiments, a deposition process including FCVD begins by transferring a substrate, such as the substrate 301 in FIG. 1, to a deposition process chamber, such as the deposition processing chamber 100 depicted in FIG. 1. The substrate 301 may have a substantially planar surface, an uneven surface, or a substantially planar surface having a structure formed thereon. In the embodiment depicted in FIG. 7A, the substrate 301 has a patterned material layer 704 disposed on an interface layer 702. In one embodiment, the patterned material layer 704 includes openings 708 formed therein. The patterned material layer 704 may be utilized to form a gate structure, a contact structure, an interconnection structure in the front end or back end processes, or any suitable structures as needed. In one embodiment, the deposition process such as FCVD may be performed on the patterned material layer 704 to form a contact structure therein. The substrate 301 may be a material such as crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire. The substrate 301 may have various dimensions, such as 200 mm, 300 mm, 450 mm or other diameter wafers, as well as, rectangular or square panels. Unless otherwise noted, embodiments and examples described herein are conducted on substrates with a 200 mm diameter, a 300 mm diameter, or a 450 mm diameter substrate. In the embodiment wherein a SOI structure is utilized for the substrate 301, the substrate 301 may include a buried dielectric layer disposed on a silicon crystalline substrate. In the embodiment depicted herein, the substrate 301 may be a crystalline silicon substrate.

In one embodiment, the interface layer 702 may be a dielectric layer. The patterned material layer 704 has the openings 708 that expose portions 710 of the interface layer 702 for depositing a dielectric material therein. The openings 708 described herein may include trenches, vias, openings and the like. In one embodiment, the patterned material layer 704 may be a metal containing material, silicon containing material, carbon containing materials, or other suitable materials. Suitable examples of the metal containing materials include copper containing material, aluminum containing materials, nickel containing material, tungsten containing material, or other metal containing materials. Suitable silicon containing materials include silicon, silicon oxide, silicon nitride, silicon oxynitride, and combinations thereof. Suitable carbon containing materials include silicon carbide, amorphous carbon or the like. In an exemplary embodiment depicted herein, the patterned material layer 704 is a silicon layer.

The interface layer 702 may be a dielectric layer, such as a dielectric oxide layer, or dielectric nitride layer as needed. The interface layer 702 may include multiple layers, composite layers, or a single layer. Other suitable materials for the dielectric layer include undoped silicon glass (USG), such as silicon oxide or TEOS, boron-silicate glass (BSG), phosphorus-silicate glass (PSG), boron-phosphorus-silicate glass (BPSG), silicon nitride, amorphous silicon, and combinations thereof.

Figure 7A:
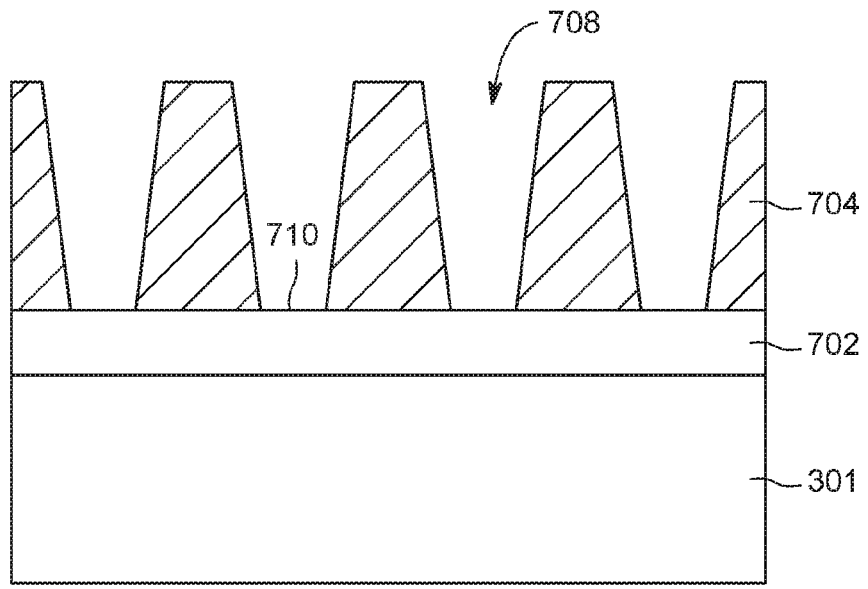
FIGS. 7A-7B depict cross-sectional views of structures formed in accordance with some embodiments of the present disclosure.

In one embodiment, the patterned material layer 704 may be patterned to a predetermined depth to expose the portions 710 of the interface layer 702, as shown in FIG. 7A. The material layer 704 may be etched or patterned in any suitable patterning process. The patterned material layer 704 may be patterned by supplying a gas mixture into the processing chamber along with a predetermined RF power level applied to the processing chamber.

In embodiments, a deposition gas mixture is supplied to the processing chamber, such as the such as deposition processing chamber 100 in FIG. 1, to perform the deposition process to form a dielectric material 706 (shown in FIG. 7B) in the openings 708. The gas mixture supplied to the deposition processing chamber 100 may be varied based on different types of materials to be formed and filled in the openings 708. In one example, when the dielectric material 706 to be formed is desired to be a silicon nitride layer, the deposition gas mixture as supplied comprises at least one silicon containing gas, nitrogen containing gas, or optionally an inert gas. In another example, when the dielectric material 706 to be formed is desired to be a silicon oxide layer, the deposition gas mixture as supplied comprises at least one silicon containing gas, oxygen containing gas, or optionally an inert gas. In another example, when the dielectric material 706 to be formed is desired to be a silicon carbide layer, the deposition gas mixture as supplied comprises at least one silicon containing gas, carbon containing gas, or optionally an inert gas. In yet another example, when the dielectric material 706 to be formed is desired to be a carbide layer, the deposition gas mixture as supplied comprises at least one carbon containing gas, or optionally an inert gas.

Suitable examples of the silicon containing gas include silane ($SiH_4$), tetraethyl orthosilicate (TEOS), disilane ($Si_2H_6$), and the like. Suitable examples of the nitrogen containing gas include nitrogen ($N_2$), ammonia ($NH_3$), nitrous oxide ($N_2O$), nitrogen dioxide ($NO_2$) and the like. Suitable examples of the oxygen containing gas include hydrogen peroxide ($H_2O_2$), water ($H_2O$), oxygen ($O_2$), ozone ($O_3$), and the like. Suitable examples of the carbon containing gas include $CO_2$, hydrocarbon gases (such as methane ($CH_4$) and ethane ($C_2H_6$), and the like. Suitable examples of the inert gas include helium (He), argon (Ar), and the like.

In some examples, carrier gases, such as nitrogen ($N_2$), hydrogen ($H_2$) and the like may also be supplied as needed in the deposition gas mixture.

In one example, the deposition gas mixture includes silicon containing gas, nitrogen or carbon containing gas, and argon (Ar), or hydrogen ($H_2$) gas. In one specific example, the deposition gas mixture includes silane ($SiH_4$), argon (Ar) or helium (He), ammonia ($NH_3$), hydrogen ($H_2$) or nitrogen ($N_2$), or combinations thereof for depositing a silicon nitride layer as the dielectric material 706. In another specific example, the deposition gas mixture includes $SiH_4$, Ar or He, $CH_4$ or $CO_2$, $H_2$ or $N_2$ for depositing a silicon carbide layer as the dielectric material 706. In yet another specific example, the deposition gas mixture includes $SiH_4$, Ar or He, $O_2$ or $NO_2$, for depositing a silicon oxide layer as the dielectric material 706.

In one embodiment, the silicon containing gas is controlled at a flow rate between about 30 sccm and about 500 sccm by volume. The oxygen, carbon, or nitrogen containing gas is controlled at a flow rate between about 50 sccm and about 2000 sccm by volume. The argon (Ar) or helium (He) gas is controlled at a flow rate between about 250 sccm and about 2000 sccm by volume.

In one embodiment, some of the gases from the deposition gas mixture may be supplied from the gas source 106 through the remote plasma source 104 to the interior processing region 151 while some of the gases may be supplied through a side of the deposition processing chamber 100, such as the fluid sources 119 that laterally formed around the showerhead 118, to be delivered to the interior processing region 151. In some examples, a first gas (e.g., the reactive precursors) from the deposition gas mixture, such as silicon containing gases, are supplied from side (e.g., the fluid sources 119) of the deposition processing chamber 100 while a second gas (e.g., the carrier gas, inert gas, carbon or nitrogen containing gases or other gases) from the deposition gas mixture are supplied from the gas source 106 through the remote plasma source 104 to the interior processing region 151. In one example, the first gas is $SiH_4$ gas supplied from the fluid sources 119 into the processing chamber while the second gas is at least one of Ar, He, $NH_3$, $H_2$, $N_2$, or combinations thereof supplied from the gas source 106 through the remote plasma source 104 to the interior processing region 151.

Figure 7B:
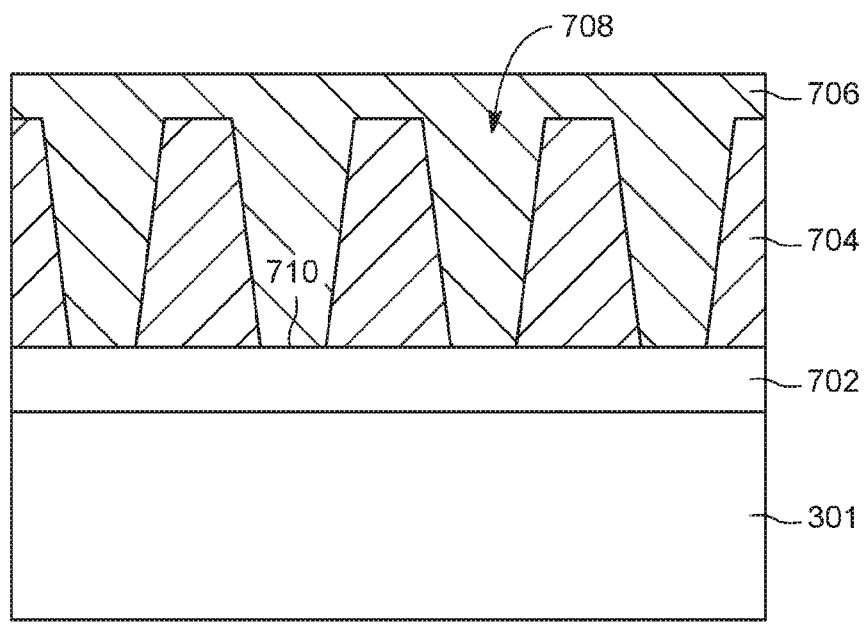

In embodiments, after the deposition gas mixture is supplied to the processing chamber of FIG. 1, a remote plasma source power is applied to the remote plasma source 104 to generate a remote plasma to be delivered from the remote plasma source 104 to the interior processing region 151. In some embodiments, remotely dissociated gas and/or other gases provide high density and low energy atomic species, as compared to conventional in-chamber RF source power applied to the showerhead, which may provide high energy but relatively low density gas radicals. Thus, by utilizing the remote plasma source with certain active gas species along with the gases supplied from the side, e.g., from the fluid sources 119, the high density gas species with relatively low energy atomic species, are then delivered to the interior processing region 151 to form the dielectric material 706 on the substrate 301, as shown in FIG. 7B. In some embodiments, the atomic gas species from the remote plasma source has higher degree of reactivity, which may react with reacting gas precursors supplied from the side, e.g., from the fluid sources 119, more efficiently, slowly and thoroughly, thus providing a good gap filling capability to fill the dielectric material 706 into the openings 708 defined in the patterned material layer 704.

In embodiments, the amount of each gas introduced into the processing chamber of FIG. 1 may be varied and adjusted to accommodate, for example, the thickness of the dielectric material 706 (e.g., the height or geometry of the openings 708) to be formed in the openings 708. In one or more embodiments, the gases supplied from the remote plasma source 104 may have certain ratios. For example, a ratio of the nitrogen or carbon containing gas to the Ar gas may be controlled between about 0.2:1 and about 2:1 by volume.

In one example, a remote RF source power of between about 1000 Watts and about 10000 Watts, such as between about 500 Watts and about 3000 Watts, is supplied to the remote plasma source 104 to generate remote plasma to be delivered to the interior processing region 151. In some embodiments, microwave energy is suitable for use herein. The frequency at which the power to the remote plasma source 104 is applied around 400 kHz. The frequency can range from about 50 kHz to about 2.45 GHz. A substrate temperature is maintained between about −20 degrees Celsius to about 200 degrees Celsius, such as between about 20 degrees Celsius and about 90 degrees Celsius.

In some deposition embodiments, while supplying the remote plasma from the remote plasma source 104 to the interior processing region 151, a pulsed RF bias power may be applied to the substrate support member 152 to generate a RF bias power to the substrate 301 disposed on the substrate support member 152. In some embodiments, the RF bias power generated to the substrate support member 152 is utilized to assist providing directionality to the plasma in the interior processing region 151 during the deposition process. In some embodiments, the RF bias power may be provided at 60 MHz and/or 2 MHz as needed. In one particular embodiment, the RF bias power is provided at 60 MHz, at 2 MHz or at 400 KHz.

In some embodiments, the RF bias power may be supplied to the substrate support member 152 in pulsed mode. In some embodiments, the RF bias power supplied in a pulse mode can provide a relatively mild RF power level to the substrate 301 disposed on the substrate support assembly so that the reactive species can be accelerated toward the substrate 301 with a relatively mild energy level. The RF bias power supplied to the substrate support member 152 may be simultaneously, concurrently, separately, alternatively, or sequentially with the remote plasma power supplied from the remote plasma source 104.

Figure 6:
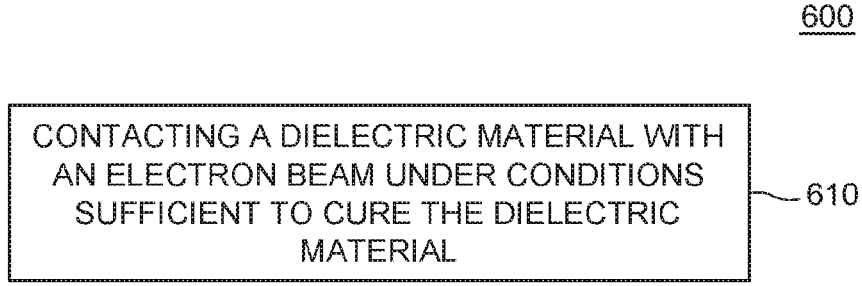
FIG. 6 is a process flow diagram illustrating a method for curing a dielectric material in accordance with some embodiments of the present disclosure.

Upon formation of the dielectric material 706, the workpiece may be moved to a process chamber of FIG. 2 or 3 for curing or altering in order to stabilize the dielectric material such as dielectric material 706. Referring now to FIG. 6, FIG. 6 is a flow chart depicting operations of a method 600 for curing a dielectric layer, including at operation 610 contacting a dielectric material with an electron beam under conditions sufficient to cure the dielectric material. In some embodiments, conditions sufficient to cure the dielectric material include the same conditions mentioned above with respect to FIG. 5. For example, for curing a dielectric layer in accordance with embodiments of the present disclosure, a process gas is delivered to a process volume of electron beam processing chamber, such as the process volume 201 of the electron beam processing chamber 200 of FIG. 2. Various process gases, such the process gas comprising one or more of helium (He), argon (Ar), hydrogen ($H_2$), ammonia ($NH_3$), disilane ($Si_2H_6$), methane ($CH_4$), acetylene ($C_2H_2$), nitrogen trifluoride ($NF_3$), tetrafluoromethane ($CF_4$), sulfur hexafluoride ($SF_6$), carbon monoxide (CO), trifluoromethane ($CHF_3$), chlorine ($CL_2$), hydrogen bromide (HBr), nitrogen ($N_2$), oxygen ($O_2$), and combinations thereof are delivered to the process volume 201 through the upper gas injectors 230, 234 from the supplies 238. In one embodiment, an inert gas is also delivered to the process volume 201. In some embodiments, the inert gas is delivered through the upper gas injectors 230. Although not illustrated with regard to FIG. 2, in another embodiment, the inert gas is delivered through the top electrode such as electrode 208. By injecting an inert gas, the probability of reactive species back diffusion can be reduced and an integrity of a plasma formed in the process volume can be better maintained.

In some curing embodiments, a low frequency RF power is delivered to an electrode disposed in the process volume. In embodiments, the electrode is formed from a high secondary electron emission coefficient material disposed in the process volume. In one embodiment, RF power having a frequency of about 2 MHz or about 13.56 MHz is applied to the top electrode such as electrode 208. In one embodiment, the RF power is applied to the top electrode such as electrode 208 in a pulsed manner. By utilizing low frequency RF power, a plasma with a high sheath voltage can be generated, which facilitates acceleration of electrons subsequently emitted from the top electrode such as electrode 208.

In one embodiment, during curing the pedestal 210 is maintained at ground potential. In another embodiment, low frequency RF power is applied to the pedestal 210. In some embodiments, the RF power applied to the pedestal 210 is concurrent with RF power applied to the electrode 208. Alternatively, the RF power applied to the pedestal 210 is delivered when substantially no RF power is applied to the electrode 208. In embodiments where RF power is applied to the pedestal 210, the RF power is controlled to reduce adverse influence on the plasma sheath potential to prevent retardation of electron beams from reaching the substrate 211.

In some embodiments, the RF power applied to the top electrode such as electrode 208 can be synchronized with the RF power applied to the pedestal 210 by pulsing such that the duty cycles of the top electrode RF power and the pedestal 210 RF power do not overlap. As a result, electrical biasing within the process volume 201 is not substantially limited and retardation of electron beams due to plasma sheath bias potential is substantially mitigated.

In some embodiments, the electrode is bombarded with ions from the plasma. In some embodiments, the plasma has a predominantly positive charge and the top electrode such as electrode 208 has a predominantly negative charge. Ions from the plasma are influenced by an electric field generated in the process volume 201 and the ions which are accelerated toward the top electrode such as electrode 208 heat the top electrode such as electrode 208. Because the top electrode is formed from a material having a high secondary electron emission coefficient, the ion bombardment of the top electrode such as electrode 208 causes electrons to be emitted from the top electrode such as electrode 208.

In some embodiments, electrons emitted from the electrode are accelerated toward a substrate. For example, electrons emitted from the top electrode such as electrode 208 are accelerated toward the substrate 211. Due the substantially negative charge of the top electrode such as electrode 208, the negatively charged electrons are repelled by the top electrode such as electrode 208 and toward the substrate 211. In some embodiments, the plasma sheath voltage potential further functions to accelerate the electrons toward the substrate 211. As the electrons are accelerated by the plasma sheath voltage, the electrons acquire energy of between about 50 electron volts (eV) and about 4,000 eV upon entry into the plasma. The electrons emitted from the top electrode such as electrode 208 generate a large area secondary electron beam. The electron beam has an energy distribution which is substantially uniform across a diameter of the substrate 211.

In some embodiments, the dielectric material is at a temperature of 0 to 500 degrees Celsius throughout the cure process of the present disclosure. In some embodiments, the dielectric material is maintained at a pressure in the process chamber, such as e.g., 3 to 100 mTorr. In some embodiments, a bias power is applied to the dielectric material in an amount of 30 to 5000 W while curing in accordance with the present disclosure In some embodiments, the present disclosure includes a method for curing a dielectric layer, including: contacting a dielectric material with an electron beam under conditions sufficient to cure the dielectric material. In some embodiments, the dielectric material is an oxynitride layer. In some embodiments, the oxynitride layer is a silicon oxynitride film. In some embodiments, curing the dielectric material reduces an oxygen content of the silicon oxynitride film and increases a nitrogen content of the silicon oxynitride film. In some embodiments, upon curing a ratio of nitrogen to oxygen to is greater than 1. In some embodiments, the dielectric material is at a temperature of 0 to 500 degrees Celsius. In some embodiments, the dielectric material is disposed with a process chamber having a pressure of 3 to 100 mTorr. In some embodiments, forming the electron beam from a reaction includes a process gas comprising one or more of helium (He), argon (Ar), hydrogen ($H_2$), ammonia ($NH_3$), disilane ($Si_2H_6$), methane ($CH_4$), acetylene ($O_2H_2$), nitrogen trifluoride ($NF_3$), tetrafluoromethane ($CF_4$), sulfur hexafluoride ($SF_6$), carbon monoxide (CO), trifluoromethane ($CHF_3$), chlorine ($CL_2$), hydrogen bromide (HBr), nitrogen ($N_2$), oxygen ($O_2$), and combinations thereof. In some embodiments, curing further includes providing a bias power to the dielectric material in an amount of 30 to 5000 W.

In some embodiments, post deposition electron beam curing improves film composition and stability, for example of a dielectric material. In some embodiments, post deposition electron beam curing in nitrogen ambient increase N:Si ratio by at least 2 times, reduces oxygen content by at least 2 times, reduces or eliminates moisture intake in to the dielectric material, and is suitable for converting bulk film compositions.

In embodiments, one or more controllers may be coupled to the deposition processing chamber 100, electron beam processing chamber 200 alone or in combination with integrated system 400 and support systems, directly (not shown) or, alternatively, via computers (or controllers) associated with the process chamber and/or the support systems. In embodiments, the controller may be one of any form of general-purpose computer processor that can be used in an industrial setting for controlling various chambers and subprocessors. The memory, or computer-readable medium of a CPU may be included including be one or more of readily available memory such as random access memory (RAM), read only memory (ROM), floppy disk, hard disk, or any other form of digital storage, local or remote. In embodiments, support circuits are coupled to a CPU for supporting the processor in a conventional manner. These circuits include cache, power supplies, clock circuits, input/output circuitry and subsystems, and the like.

In some embodiments, the present disclosure relates to a non-transitory computer readable medium having instructions stored thereon that, when executed, cause a method for forming an integrated circuit structure, including: delivering a process gas to a process volume of a process chamber; applying RF power to an electrode formed from a high secondary electron emission coefficient material disposed in the process volume; generating a plasma comprising ions in the process volume; bombarding the electrode with the ions to cause the electrode to emit electrons and form an electron beam; and contacting a dielectric material with the electron beam to cure the dielectric material.

In some embodiments, the present disclosure relates to a non-transitory computer readable medium having instructions stored thereon that, when executed, cause a method for curing a dielectric material, including: delivering a process gas to a process volume of a process chamber; applying RF power to an electrode formed from a high secondary electron emission coefficient material disposed in the process volume; generating a plasma comprising ions in the process volume; bombarding the electrode with the ions to cause the electrode to emit electrons and form an electron beam; and contacting a dielectric material with the electron beam to cure the dielectric material. In some embodiments, the dielectric material is a flowable chemical vapor deposition product, such as SiN, or SiN having hydrogen incorporated into the chemical vapor deposition product.

In some embodiments, the present disclosure relates to a non-transitory computer readable medium having instructions stored thereon that, when executed, cause a method for curing a dielectric layer, including: contacting a dielectric material with an electron beam under conditions sufficient to cure the dielectric material. In some embodiments, the dielectric material is a flowable chemical vapor deposition product, such as SiN, or SiN having hydrogen incorporated into the chemical vapor deposition product.

While the foregoing is directed to embodiments of the present disclosure, other and further embodiments of the disclosure may be devised without departing from the basic scope thereof.

The invention claimed is:

1. A method for forming an integrated circuit structure, comprising:
    delivering a process gas to a process volume of a process chamber;
    applying RF power to an electrode formed from a high secondary electron emission coefficient material disposed in the process volume;
    generating a plasma comprising ions in the process volume;
    bombarding the electrode with the ions to cause the electrode to emit electrons and form an electron beam; and
    contacting a dielectric material with the electron beam to cure the dielectric material, wherein the dielectric material is a flowable chemical vapor deposition product, wherein the dielectric material is a silicon oxynitride layer characterized as SiOxNy, wherein x is a number greater than or equal to 1 and less than or equal to 2 and y is a number greater than or equal to 1 and less than or equal to 2, wherein curing the dielectric material reduces x and increases y.

2. The method of claim 1, wherein upon curing a ratio of y to x is greater than 1.

3. The method of claim 1, wherein the dielectric material is at a temperature of 0 to 500 degrees Celsius.

4. The method of claim 1, wherein a pressure of the process chamber is 3 to 100 mTorr.

5. The method of claim 1, wherein the process gas comprises one or more of helium (He), argon (Ar), hydrogen ($H_2$), ammonia ($NH_3$), disilane ($Si_2H_6$), methane ($CH_4$), acetylene ($C_2H_2$), nitrogen trifluoride ($NF_3$), tetrafluoromethane ($CF_4$), sulfur hexafluoride ($SF_6$), carbon monoxide (CO), trifluoromethane ($CHF_3$), chlorine ($Cl_2$), hydrogen bromide (HBr), nitrogen ($N_2$), or oxygen ($O_2$).

6. The method of claim 1, further comprising providing a bias power to the dielectric material in an amount of 30 W to 5000 W.

7. The method of claim 1, further comprising depositing the dielectric material upon a substrate via flowable chemical vapor deposition.

8. A computer readable medium, having instructions stored thereon which, when executed, cause a process chamber to perform a method of forming an integrated circuit structure, the method as described in claim 1.

9. A method for forming an integrated circuit structure, comprising:
    delivering a process gas to a process volume of a process chamber;
    applying RF power to an electrode formed from a high secondary electron emission coefficient material disposed in the process volume;
    generating a plasma comprising ions in the process volume;
    bombarding the electrode with the ions to cause the electrode to emit electrons and form an electron beam; and
    contacting a dielectric material deposited in a feature of a substrate with the electron beam to cure the dielectric material, wherein the dielectric material is a flowable chemical vapor deposition product, and wherein contacting the dielectric material with the electron beam reduces atomic oxygen percentage of the dielectric material and increases atomic nitrogen percentage of the dielectric material.

10. The method of claim 9, wherein the dielectric material is an oxynitride layer.

11. The method of claim 9, wherein the dielectric material is at a temperature of 0 to 500 degrees Celsius.

12. The method of claim 9, wherein a pressure of the process chamber is 3 to 100 mTorr.

13. The method of claim 9, wherein the process gas comprises one or more of helium (He), argon (Ar), hydrogen ($H_2$), ammonia ($NH_3$), disilane ($Si_2H_6$), methane ($CH_4$), acetylene ($C_2H_2$), nitrogen trifluoride ($NF_3$), tetrafluoromethane ($CF_4$), sulfur hexafluoride ($SF_6$), carbon monoxide (CO), trifluoromethane ($CHF_3$), chlorine ($Cl_2$), hydrogen bromide (HBr), nitrogen ($N_2$), or oxygen ($O_2$).

14. The method of claim 9, further comprising providing a bias power to the dielectric material in an amount of 30 W to 5000 W.

15. The method of claim 9, further comprising depositing the dielectric material upon a substrate via flowable chemical vapor deposition.

* * * * *